United States Patent
Pavier

(10) Patent No.: US 12,068,274 B2
(45) Date of Patent: Aug. 20, 2024

(54) SEMICONDUCTOR DIE BEING CONNECTED WITH A CLIP AND A WIRE WHICH IS PARTIALLY DISPOSED UNDER THE CLIP

(71) Applicant: Infineon Technologies AG, Neubiberg (DE)

(72) Inventor: Mark Pavier, Felbridge (GB)

(73) Assignee: Infineon Technologies AG, Neubiberg (DE)

( * ) Notice: Subject to any disclaimer, the term of this patent is extended or adjusted under 35 U.S.C. 154(b) by 229 days.

(21) Appl. No.: 17/110,755

(22) Filed: Dec. 3, 2020

(65) Prior Publication Data

US 2021/0175200 A1    Jun. 10, 2021

(30) Foreign Application Priority Data

Dec. 5, 2019 (DE) .......................... 102019133234.6

(51) Int. Cl.
*H01L 23/00* (2006.01)
(52) U.S. Cl.
CPC .............. *H01L 24/73* (2013.01); *H01L 24/92* (2013.01); *H01L 2224/73221* (2013.01); *H01L 2224/92166* (2013.01)
(58) Field of Classification Search
CPC ......... H01L 24/73; H01L 24/32; H01L 24/84; H01L 24/85
See application file for complete search history.

(56) References Cited

U.S. PATENT DOCUMENTS

| | | | |
|---|---|---|---|
| 6,046,075 A | 4/2000 | Manteghi | |
| 6,566,749 B1 | 5/2003 | Joshi et al. | |
| 8,441,120 B1 | 5/2013 | Arcedera et al. | |
| 2002/0140112 A1 | 10/2002 | Pon | |
| 2004/0080028 A1 | 4/2004 | Yanagisawa | |
| 2008/0012045 A1* | 1/2008 | Muto | H01L 24/37 438/117 |
| 2008/0054434 A1* | 3/2008 | Kim | H01L 25/105 257/E23.002 |
| 2009/0102067 A1 | 4/2009 | Wyland | |

(Continued)

FOREIGN PATENT DOCUMENTS

DE    102008051965 A1    7/2009

OTHER PUBLICATIONS

Definition of "layer", http://www.dictionary.com (2022) (Year: 2022).*

*Primary Examiner* — Michele Fan
(74) *Attorney, Agent, or Firm* — Murphy, Bilak & Homiller, PLLC

(57) ABSTRACT

A semiconductor device includes a first carrier, a first external contact, a second external contact, and a first semiconductor die. The first semiconductor die has a first main face, a second main face opposite to the first main face, a first contact pad disposed on the first main face, a second contact pad disposed on the second main face, a third contact pad disposed on the second main face, and a vertical transistor. The first semiconductor die is disposed with the first main face on the first carrier. A clip connects the second contact pad and the second external contact. A first wire is connected with the first external contact. The first wire is disposed at least partially under the clip.

20 Claims, 8 Drawing Sheets

(56) References Cited

U.S. PATENT DOCUMENTS

| | | | |
|---|---|---|---|
| 2009/0108467 A1* | 4/2009 | Otremba | H01L 25/18 |
| | | | 438/109 |
| 2010/0244213 A1 | 9/2010 | Nozaki | |
| 2011/0089564 A1 | 4/2011 | Oh et al. | |
| 2012/0146165 A1* | 6/2012 | Ausserlechner | H01L 24/34 |
| | | | 257/421 |
| 2015/0214133 A1* | 7/2015 | Otremba | H01L 23/49548 |
| | | | 438/122 |
| 2017/0338168 A1 | 11/2017 | Park et al. | |
| 2017/0365544 A1* | 12/2017 | Mohamed | H01L 24/83 |
| 2019/0259689 A1* | 8/2019 | Lui | H05K 1/0265 |
| 2021/0134762 A1* | 5/2021 | Hayashi | H01L 24/48 |

\* cited by examiner

SEMICONDUCTOR DIE BEING CONNECTED WITH A CLIP AND A WIRE WHICH IS PARTIALLY DISPOSED UNDER THE CLIP

TECHNICAL FIELD

The present disclosure is related to a semiconductor device and to a method for fabricating a semiconductor device. The present disclosure is in particular related to a semiconductor device which comprises a semiconductor die having contact pads on both main faces thereof, a clip connected with one of the contact pads, and a wire, wherein the wire is disposed at least partially under the clip.

BACKGROUND

In the field of semiconductor transistor device fabrication, improvements in semiconductor die technology lead to reducing sizes of semiconductor dies. This enables less space on top of the die for soldering or sintering a clip to the source electrode. The clip often has to be reduced in size in order to accommodate a gate bond wire or a current sense bond wire. This reduces the area available for top side cooling of the package.

SUMMARY

A first aspect of the present disclosure is related to a semiconductor device comprising a first carrier, a first external contact and a second external contact, a first semiconductor die comprising a first main face and a second main face opposite to the first main face, a first contact pad disposed on the first main face, a second contact pad disposed on the second main face, and a third contact pad disposed on the second main face, wherein the semiconductor die comprises a vertical transistor and is disposed with its first main face on the first carrier, a clip connecting the second contact pad and the second external contact and a first wire connected with the first external contact, wherein the first wire is disposed at least partially under the clip.

A second aspect of the present disclosure is related to a method for fabricating a semiconductor device, comprising providing a carrier, providing first and second external contacts, providing a semiconductor die comprising a first main face and a second main face opposite to the first main face, a first contact pad disposed on the first main face and a second contact pad disposed on the second main face, wherein the semiconductor die comprises a vertical transistor, disposing the semiconductor die with its first main face onto the carrier, providing a wire, connecting the wire with the second external contact, providing a clip, connecting the clip between the second contact pad and the first external contact, wherein connecting the wire is carried out before connecting the clip, and wherein the method is carried in such a way that the wire is electrically isolated from the clip.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description.

The elements of the drawings are not necessarily to scale relative to each other. Like reference numerals designate corresponding similar parts.

DETAILED DESCRIPTION

Figure 1A:
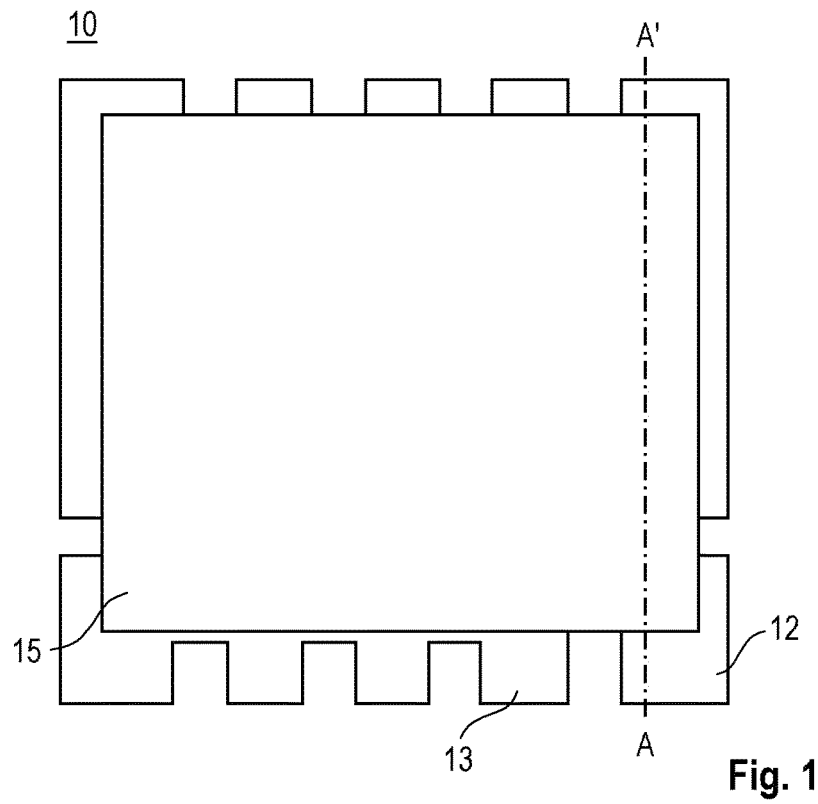
FIGS. 1A to 1C show a top view of the clip and the external contacts (FIG. 1A), a view of the clip from below (FIG. 1B), and a cross-sectional view of a semiconductor device (FIG. 1C) along a plane designated with A"-A" in FIG. 1A, in which device an insulation layer in the form of a strip is disposed onto a portion of the clip.

The present disclosure makes it possible to place the bond wire onto the die and to allow a large clip to be placed over the die, in particular onto the source or emitter electrode of a semiconductor MOSFET die or IGBT die. This can be achieved by, for example, creating a clip with selectively thinned regions below which the bond wires can be placed. In order to ensure the bond wire does not form an electrical contact to the clip (at source or emitter potential), a dielectric may be deposited onto the clip prior to assembly of the clip onto the die or to cover the bond wire before assembly of the clip. The dielectric may be applied by jetting or screening onto the clip, or by other dispense processes. The large clip can be over-molded or exposed to allow efficient dual side cooling.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Figure 1B:
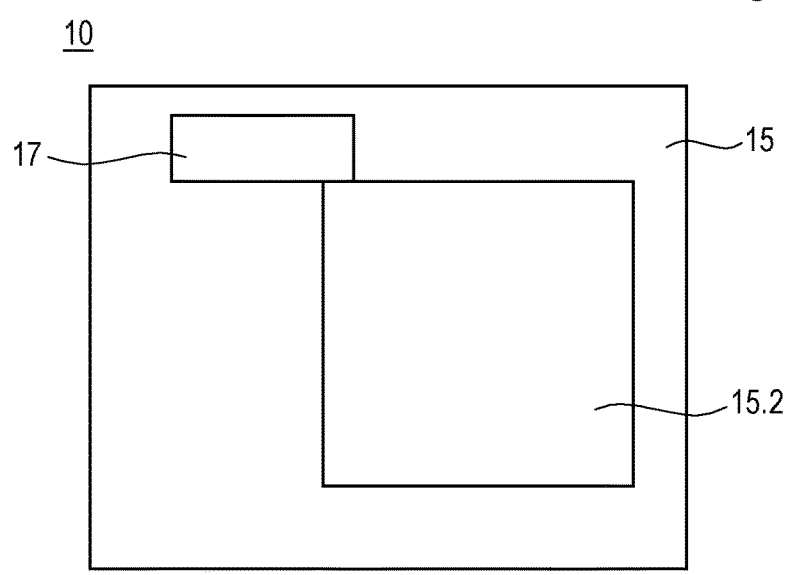
Figure 1C:
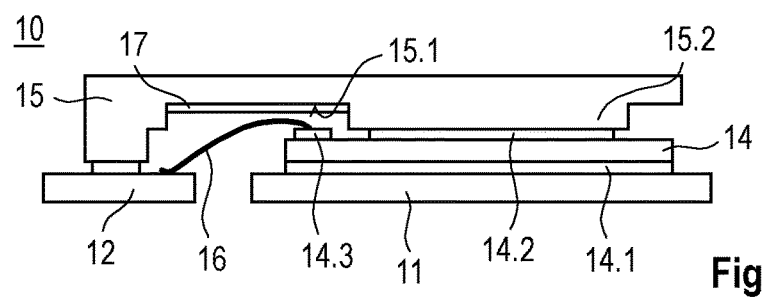

FIGS. 1A to 1C show a yet unpackaged semiconductor device 10, in which device an insulation layer 17 in the form of a strip is disposed onto a portion of the clip 15. FIG. 1A show a top view of the clip and the external contacts, FIG. 1B shows a view of the clip from below, and FIG. 1C shows a cross-sectional view of a semiconductor device along a plane designated with A"-A" in FIG. 1A, in which device an insulation layer in the form of a strip is disposed onto a portion of the clip.

The semiconductor device 10 of FIGS. 1A to 1C comprises a carrier 11, a first external contact 12 and a second external contact 13, a first semiconductor die 14 comprising a first main face and a second main face opposite to the first main face, a first contact pad 14.1 disposed on the first main face, a second contact pad 14.2 disposed on the second main face, and a third contact pad 14.3 disposed on the second main face, wherein the semiconductor die 14 comprises a vertical transistor and is disposed with its first main face on the first carrier 11. The semiconductor device 10 further comprises a clip 15 connecting the second contact pad 14.2 and the second external contact 13, and a bond wire 16 connected between the third contact pad 14.3 and the first external contact 12, wherein the bond wire 16 is disposed under the clip 15.

According to an embodiment of the semiconductor device 10, the first wire 16 is disposed completely under the clip 15. It is also possible that the bond wire 16 is disposed only partially under the clip.

According to an embodiment of the semiconductor device 10, the second contact pad 14.2 is completely covered by the clip 15. It is also possible that the second contact pad 14.2 is not completely covered by the clip 15.

According to an embodiment of the semiconductor device 10, the clip 15 comprises a cavity which is disposed at least in a region above the wire 16. In other words, the clip 15 may comprise portions of different thickness wherein the cavity is formed by relatively thin regions. In FIG. 1C it can be seen that a relatively thick portion of the clip 15 is connected with the second contact pad 14.2. This relatively thick portion is marked in FIG. 2B as a rectangular area 15.2 surrounded by a black border. And the clip 15 may comprise a relatively thin portion which is located outside the square area in FIG. 2B and which thus forms a circumferential cavity. A part of this relatively thin portion is located above the wire 16. It can also be the case that the relatively thin portion only consists of a small rectangular portion located above the wire.

According to an embodiment of the semiconductor device 10, an insulation layer 17 is disposed on a portion of the clip 15 which portion is disposed above the wire 16. As is shown in the embodiment of FIGS. 1A to 1C, the insulation layer 17 can have the form of a rectangular strip, the strip being disposed above the wire. As is further shown in the embodiment of FIGS. 1A to 1C, the insulation layer 17 can be disposed on the bottom of the cavity formed in clip 15. The purpose of the insulation layer 17 is to prevent a possible short-circuit between the bond wire 16 and the clip 15.

According to an embodiment of the semiconductor device 10, the insulation layer 17 comprises one or more of a dielectric, an epoxy type dielectric, a foil, and a film.

According to an embodiment of the semiconductor device 10, the insulation layer 17 comprises a thickness in a range from 2 µm to 100 µm, wherein the lower bound can also be 3 µm, 4 µm, 5 µm, 6 µm, 7 µm, 8 µm, 9 µm, or 10 µm, and the upper bound can also be 90 µm, 80 µm, 70 µm, 60 µm, or 50 µm, and wherein the range can be in particular from 5 µm to 30 µm.

According to an embodiment of the semiconductor device 10, the carrier 11 and the first and second external contacts 12 and 13 are parts of a leadframe.

Figure 2A:
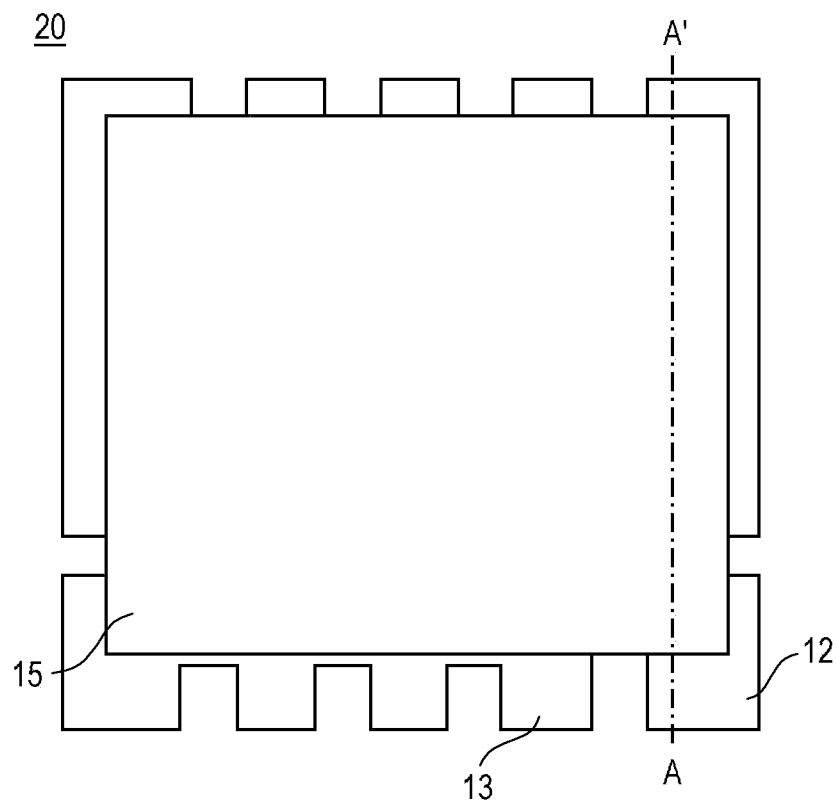
FIGS. 2A and 2B show a top view of the clip and the external contacts (FIG. 2A), and a cross-sectional view of a semiconductor device (FIG. 2B) along a plane designated with A"-A" in FIG. 2A, in which device an insulator body is connected to a portion of the wire.
Figure 2B:
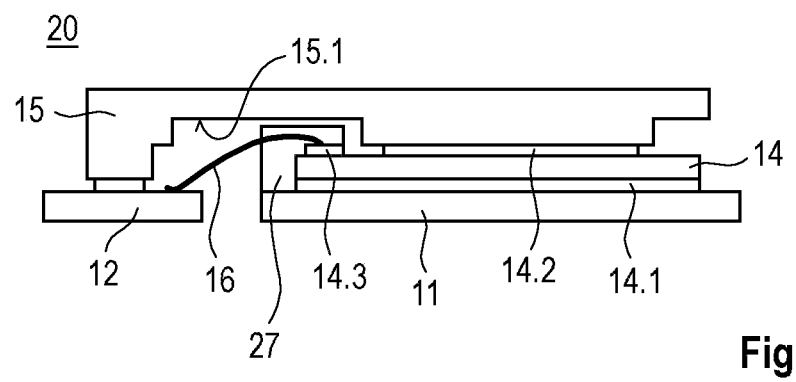

FIGS. 2A and 2B shows a yet unpackaged semiconductor device 20, in which device an insulator body 27 is connected to a portion of the wire 26. FIG. 2A shows a top view and FIG. 2B shows a cross-sectional view of a semiconductor device along a plane designated with A'-A' in FIG. 2A.

The semiconductor device 20 of FIGS. 2A and 2B is constructed in a similar way as the semiconductor device 10 of FIGS. 1A to 1C so that the details are not repeated here. As a difference to the semiconductor device 10 of FIGS. 1A to 1C, an insulator body 27 is connected to a portion of the wire 16, wherein the insulator body 27 is also connected to the second main face of the semiconductor die 14. The purpose of the insulation body 27 is also here to prevent a possible short-circuit between the bond wire 16 and the clip 15.

According to an embodiment of the semiconductor device 20 of FIGS. 2A and 2B, the insulator body 27 is also connected to a side face of the semiconductor die 14 and to a main face of the carrier 11.

According to an embodiment of the semiconductor device 20 of FIGS. 2A and 2B, the insulator body 27 comprises one or more of a dielectric, and an epoxy type dielectric.

Figure 3A:
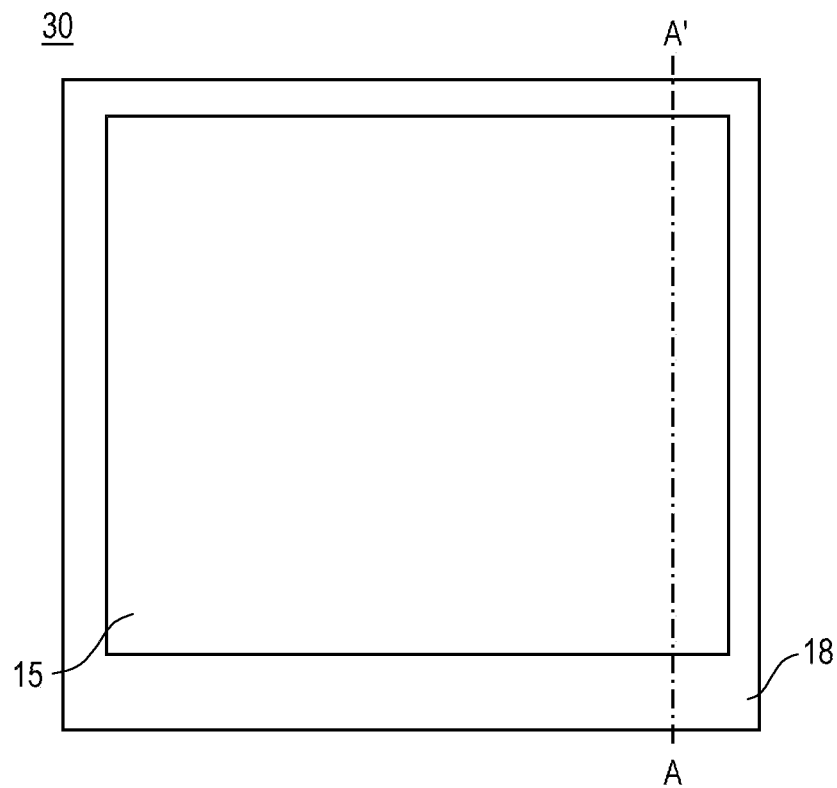
FIGS. 3A and 3B show the semiconductor device of FIGS. 1A to 1C after applying an encapsulant to the semiconductor device in a top view (FIG. 3A) and in a cross-sectional view along a plane designated with A"-A" in FIG. 3A (FIG. 3B), wherein the encapsulant is disposed such that a main upper face of the clip is exposed to the outside.
Figure 3B:
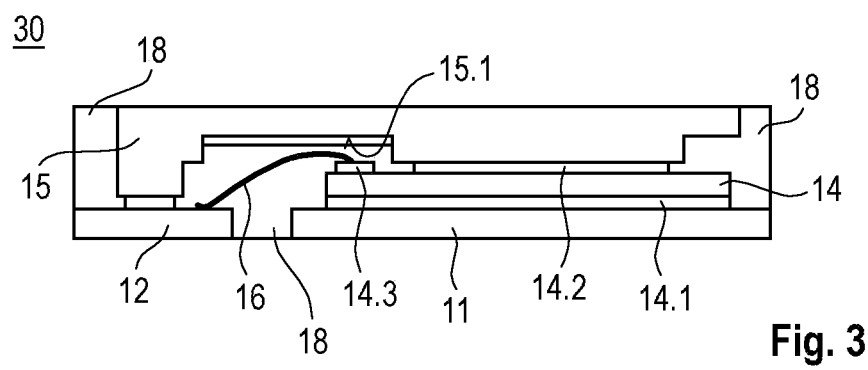

FIGS. 3A and 3B show a semiconductor device 30 obtained after applying an encapsulant 18 to the semiconductor device 10 of FIGS. 1A to 1C. FIG. 3A shows a top view and FIG. 3B shows a cross-sectional view along a plane designated with A'-A' in FIG. 3A. The encapsulant 18 can comprise any kind of resin material, in particular epoxy resin material, and it can be applied by, for example, transfer molding or compression molding. As can be seen in FIGS. 3A and 3B, the encapsulant 18 is applied in such a way that it covers the side faces of the clip 15 and is also filled into the inner space between the carrier 11, the external contacts 12 and 13, the semiconductor die 14, and the clip 15. More important is that the encapsulant 18 is applied in such a way that a main upper face of the clip 15 is exposed to the outside. This allows a customer to apply a heatsink on the exposed upper face of the clip 15 for dissipating the heat produced during operation of the semiconductor device. Moreover, also the lower main face of the carrier 11 can be left exposed to the outside so that the heat can also be dissipated from the carrier 11 to a PCB or any other substrate on which the carrier 11 is mounted (double-side cooling).

Figure 4A:
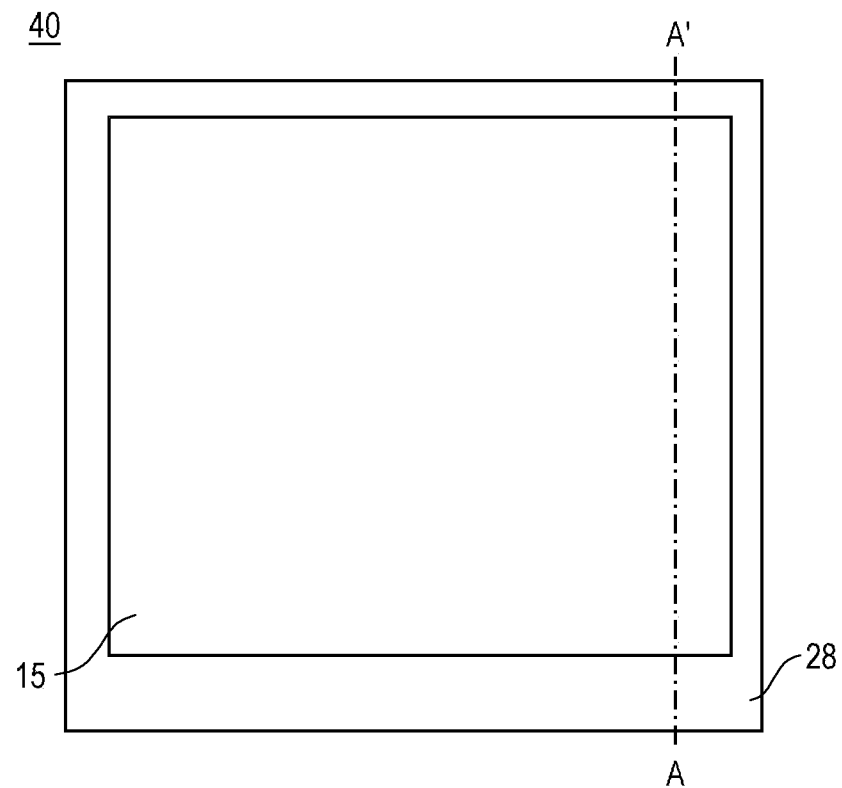
FIGS. 4A and 4B show the semiconductor device of FIGS. 2A and 2B after applying an encapsulant to the semiconductor device in a top view (FIG. 4A) and in a cross-sectional view along a plane designated with A"-A" in FIG. 4A (FIG. 4B), wherein the encapsulant is disposed such that a main upper face of the clip is exposed to the outside.
Figure 4B:
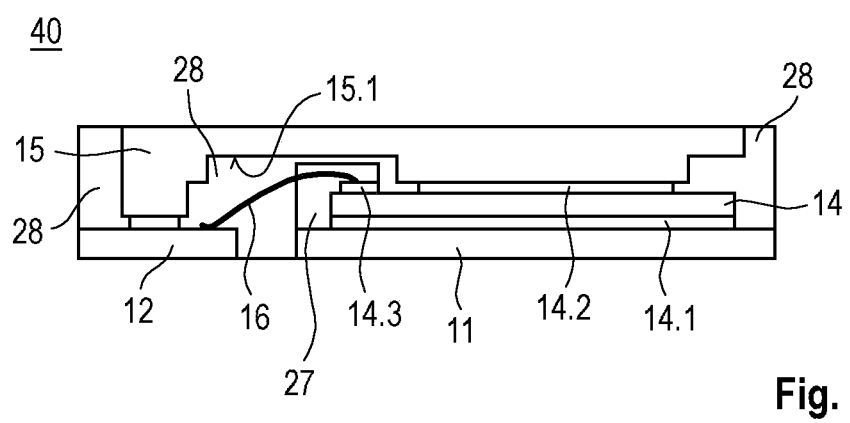

FIGS. 4A and 4B show a semiconductor device 40 obtained after applying an encapsulant 28 to the semiconductor device 20 of FIGS. 2A and 2B. FIG. 4A shows a top view and FIG. 4B shows a cross-sectional view along a plane designated with A"-A" in FIG. 4A. The encapsulant 28 is applied to the semiconductor device 20 in the same way as was described in the preceding paragraph for the encapsulant 18 so that the details will not be repeated here.

Figure 5A:
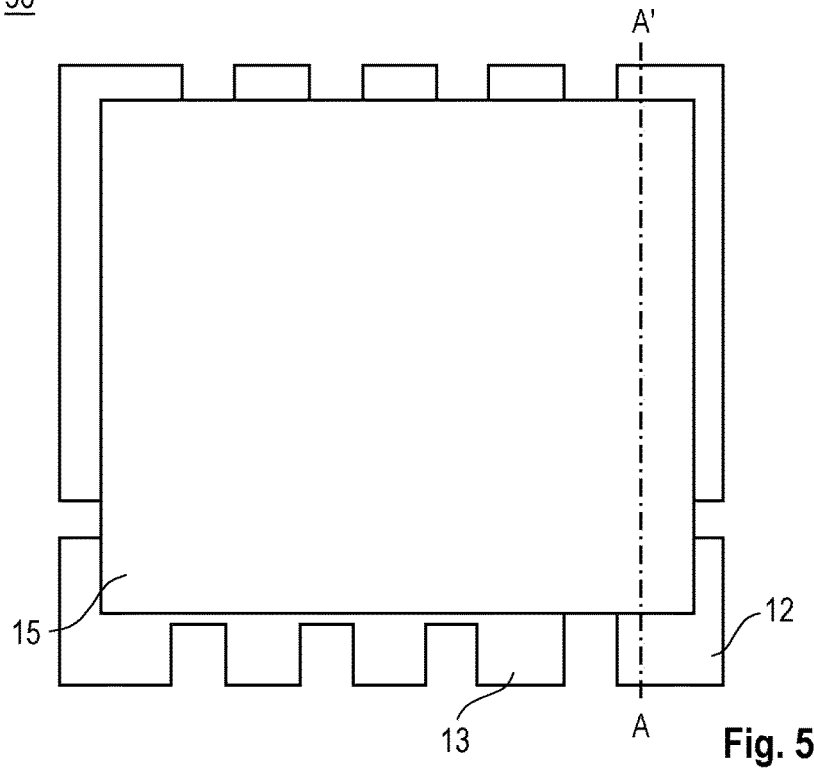
FIG. 5A to 5C show a top view of the clip and the external contacts (FIG. 5A), a view of the clip from below (FIG. 5B), and a cross-sectional view of a semiconductor device along a plane designated with A"-A" in FIG. 5A (FIG. 5C), in which device an insulation layer in the form of a closed ring is disposed onto a portion of the clip.
Figure 5B:
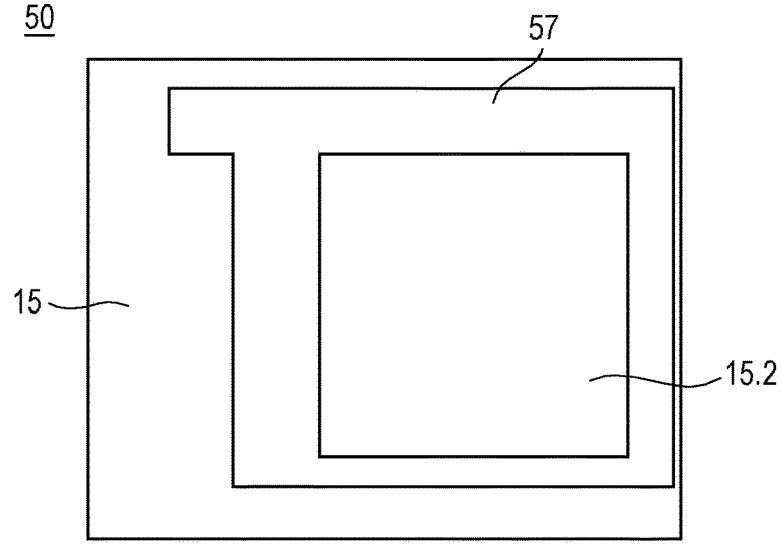
Figure 5C:
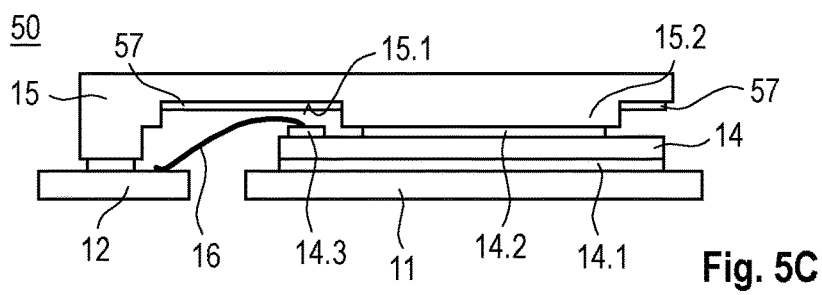

FIGS. 5A to 5C show a yet unpackaged semiconductor device 50. FIG. 5A shows a top view, FIG. 5B shows a view from below, and FIG. 5C shows a cross-sectional view along a plane designated with A"-A" in FIG. 5A.

The semiconductor device 50 of FIGS. 5A to 5C is constructed in a similar way as the semiconductor device 10 of FIGS. 1A to 1C so that the details which are common between the two devices are not repeated here. As a difference to the semiconductor device 10 of FIGS. 1A to 1C, the insulation layer 57 has the form of a closed ring, the closed ring comprising a portion which is disposed above the wire 16. Similar as the semiconductor device 10 of FIGS. 1A to 1C, the semiconductor device 50 of FIGS. 5A to 5C also comprises a circumferential cavity 15.1. The insulation layer 57 is disposed on the bottom of the entire circumference of the cavity 15.1, in particular on a ring which is adjacent to the rectangular area 15.2. The ring like insulation layer 57 may prove to be advantageous as it may help to additionally electrically insulate the temporarily high-voltage clip from lower regions of the semiconductor die 14.

Figure 6:
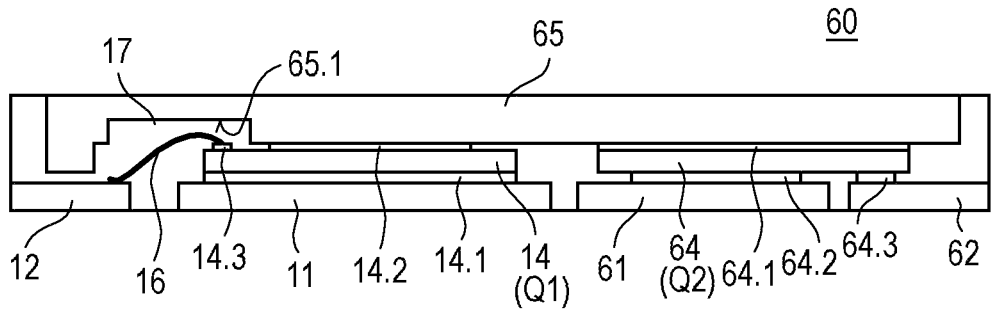
FIG. 6 shows a cross-sectional view of a packaged semiconductor device, which device comprises a second semiconductor die which is electrically connected by the clip with the first semiconductor die, wherein both semiconductor dies are comprised of MOSFET dies.

FIG. 6 shows a cross-sectional view of a packaged semiconductor device 60.

The semiconductor device 60 of FIG. 6 comprises a left hand portion and a right hand portion, wherein the left hand portion is constructed similar to the semiconductor device 30 as shown in FIGS. 3A and 3B so that the same reference signs were used and description thereof will not be repeated here. The clip is designated here with reference sign 65. The clip 65 further comprises a cavity 65.1 and an insulation layer 17 disposed on the bottom of the cavity. In the right hand portion the semiconductor device 60 comprises a second semiconductor die 64 which is electrically connected with the clip 65 and is further electrically connected by the clip 65 with the first semiconductor die 14. Both semiconductor dies 14 and 64 are comprised of MOSFET dies. In particular, the two MOSFETs 14 and 64 can be arranged in a half-bridge configuration where a first MOSFET (14; Q1) connects the input voltage to the output filter, and the second MOSFET (64; Q2) connects ground to the output filter. These two MOSFETs 14 and 64 produce the duty-cycle modulated square wave that is then low-pass filtered, resulting in the output voltage. The second MOSFET, which acts as a synchronous rectifier, is commonly referred to as the "Sync FET", whereas the first MOSFET with the low duty-cycle is called the "Control FET".

In particular, the semiconductor device 60 comprises a second carrier 61, a third external contact 62, a second semiconductor die 64 comprising a first main face and a second main face opposite to the first main face, a first contact pad 64.1 disposed on the first main face, a second contact pad 64.2 disposed on the second main face, and a third contact pad 64.3 disposed on the second main face, wherein the second semiconductor die 64 comprises a vertical transistor and is connected with its first contact pad 64.1 to the clip 65. The first contact pad 64.1 is the drain (or collector) contact pad and the second contact pad 64.2 is the source (or emitter) contact pad. In such a way the second semiconductor die 64 is connected in series with the first semiconductor die 14 for building the half-bridge circuit.

Figure 7:
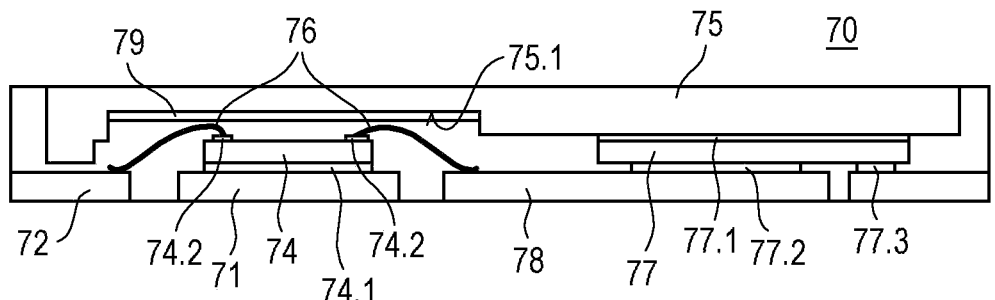
FIG. 7 shows a cross-sectional view of a packaged semiconductor device, which device comprises a second semiconductor die, wherein the first semiconductor die is an IC die and the second semiconductor die is a MOSFET die, and bond wires of the IC die are covered by the clip.

FIG. 7 shows a cross-sectional view of a packaged semiconductor device 70.

The semiconductor device 70 of FIG. 7 comprises a first semiconductor die which is an IC die and a second semiconductor die which is a MOSFET die, and bond wires of the IC die are covered by the clip.

In particular, the semiconductor device 70 of FIG. 7 comprises a first carrier 71, a first external contact 72, and a second external contact (not shown), a first semiconductor die 74 comprising a first main face and a second main face opposite to the first main face, a first contact pad 74.1 disposed on the first main face, second contact pads 74.2 disposed on the second main face, wherein the first semiconductor die 74 comprises an IC circuit and is disposed with its first contact pad 74.1 on the first carrier 71. The semiconductor device 70 further comprises a second carrier 78, and a second semiconductor die 77 comprising a first main face and a second main face opposite to the first main face, a first contact pad 77.1 disposed on the first main face, a second contact pad 77.2 disposed on the second main face, and a third contact pad 77.3 disposed on the second main face. The semiconductor device 70 further comprises a clip 75, wherein the second semiconductor die 77 is connected with its first contact pad 77.1 to the clip 75 and the clip 75 is connected to the second external contact.

In particular, the semiconductor device 70 further comprises bond wires 76, wherein a first one of the bond wires 76 connects a first one of the second contact pads 74.2 with the first external contact 72, and a second one of the bond wires 76 connects a second one of the second contact pads 74.2 with the second carrier 76. Both bond wires 76 are disposed completely under the clip 75. The clip 75 further comprises a cavity 75.1 and an insulation layer 79 disposed on the bottom of the cavity.

In particular, the semiconductor device 70 maybe a combination of an IC die 74 and a Synch FET die 77 of a half-bridge circuit as was described before, wherein the IC die 74 controls the gate of the Synch FET die 77.

Figure 8:
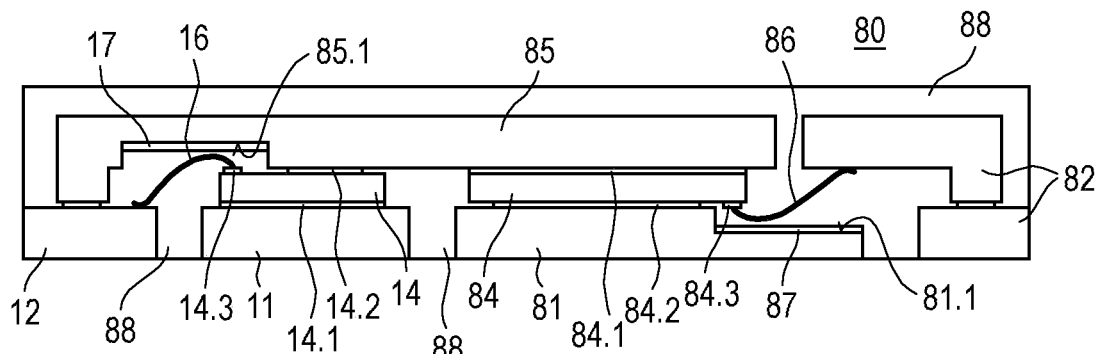
FIG. 8 shows a cross-sectional view of a packaged semiconductor device, which device comprises a second semiconductor die which is electrically connected by the clip with the first semiconductor die, wherein both semiconductor dies are comprised of MOSFET dies, and the second semiconductor die is mounted on a second carrier and connected with a second bond wire to an external contact, and a further insulation layer is disposed on a portion of the second carrier which covers the second bond wire, wherein an upper main face of the clip is not exposed to the outside.

FIG. 8 shows a cross-sectional view of a packaged semiconductor device 80.

The semiconductor device 80 of FIG. 8 is similar to the semiconductor device 60 of FIG. 6 and comprises also a left hand portion and a right hand portion, wherein the left hand portion is constructed similar to the semiconductor device 30 as shown in FIGS. 3A and 3B so that the same reference signs were used and description of the respective elements will not be repeated here. The clip is designated here with reference sign 85. In the right hand portion the semiconductor device 80 comprises a second semiconductor die 84 which is electrically connected with the clip 85 and is further electrically connected by the clip 85 with the first semiconductor die 14. Both semiconductor dies 14 and 84 are comprised of MOSFET dies. In particular, the two MOSFETs 14 and 84 can again be arranged in a half-bridge configuration where the first MOSFET die 14 acts as the Q1 transistor, and the second MOSFET die 84 acts as the Q2 transistor.

In particular, the semiconductor device 80 comprises a second carrier 81, a third external contact 82, a second semiconductor die 84 comprising a first main face and a second main face opposite to the first main face, a first contact pad 84.1 disposed on the first main face, a second contact pad 84.2 disposed on the second main face, and a third contact pad (not shown) disposed on the second main face, wherein the second semiconductor die 84 comprises a vertical transistor and is connected with its first contact pad 84.1 to the clip 85 and with its second contact pad 84.2 to the second carrier 81. The first contact pad 84.1 is the drain (or collector) contact pad and the second contact pad 84.2 is the source (or emitter) contact pad. In such a way the second semiconductor die 84 is connected in series with the first semiconductor die 14 for building the half-bridge circuit.

In difference to the embodiment of FIG. 6, the semiconductor device 80 of FIG. 8 comprises a second bond wire 86 which is implemented to connect the second contact pad 84.2 to the third external contact 82. In particular, the second carrier 81 comprises a recessed portion 81.1 and a second insulation layer 87 disposed on an upper surface of the recessed portion 81.1. The recessed portion 81.1 and the second insulation layer 87 are disposed below the second bond wire 86.

In further difference to the embodiment of FIG. 6, the semiconductor device 80 of FIG. 8 comprises an encapsulant 88 which is applied in such a way that the clip 85 is over-molded, in other words an upper main face of the clip 85 is not exposed to the outside.

Figure 9:
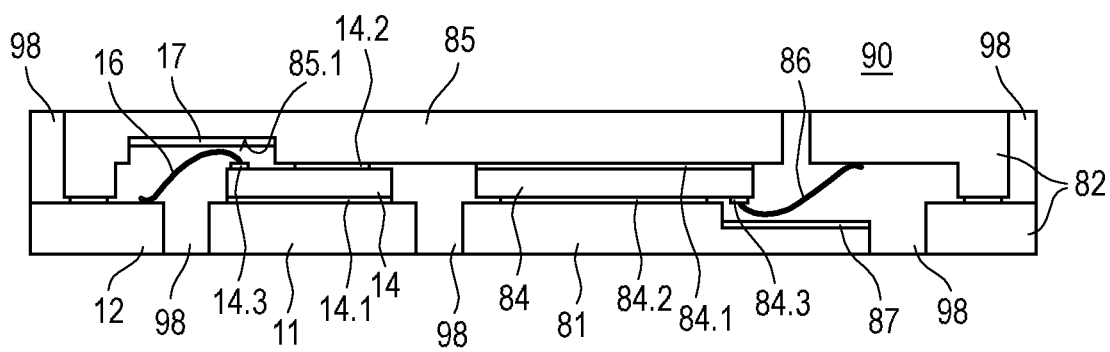
FIG. 9 shows a cross-sectional view of a packaged semiconductor device, which device is similar to the device of FIG. 8 with the exception that the upper main face of the clip is exposed to the outside.

FIG. 9 shows a cross-sectional view of a packaged semiconductor device 90.

The semiconductor device 90 of FIG. 9 is similar to the semiconductor device 80 of FIG. 8 so that mainly the same reference signs were used and description of the respective elements will not be repeated here. The only difference to the semiconductor device 80 of FIG. 8 is that an encapsulant 98 is applied in such a way that the upper main face of the clip 85 is exposed to the outside. Since also the lower main faces of the first and second carriers 11 and 81 are exposed to the outside, double-sided cooling is possible on the customer's side.

Figure 10:
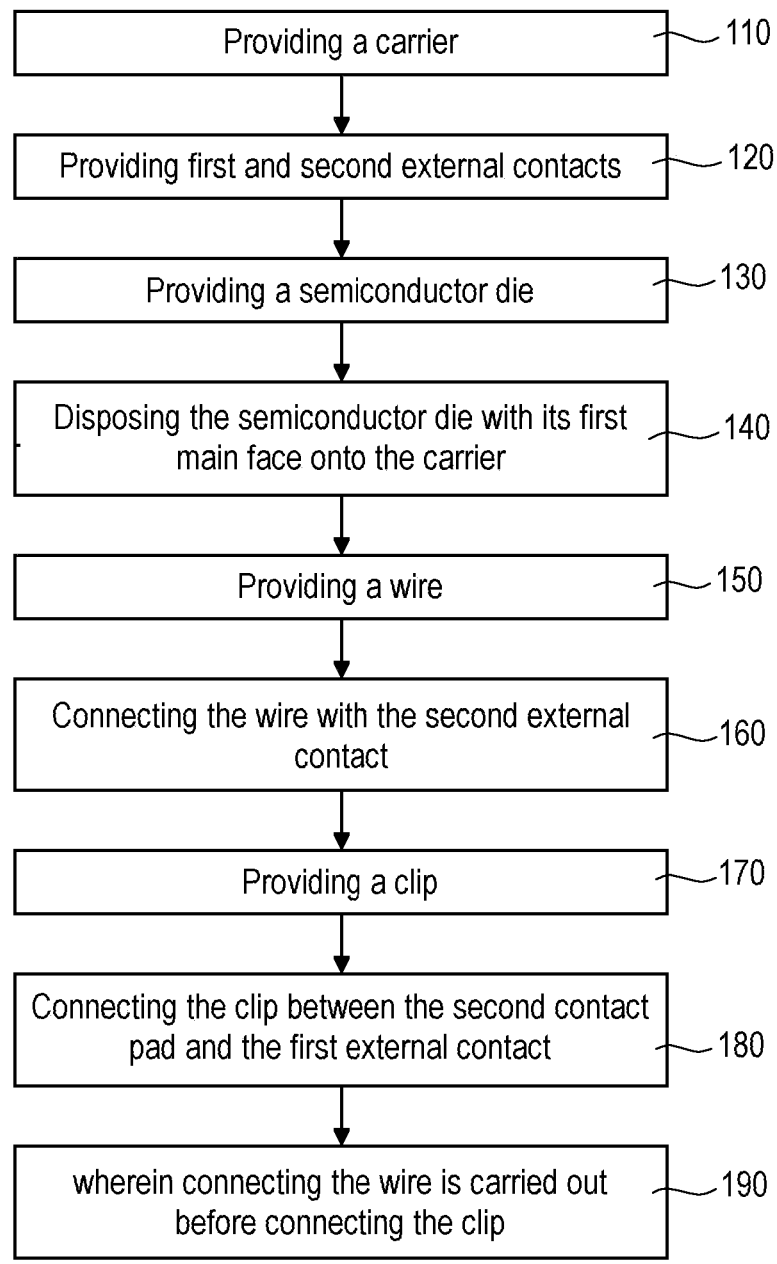
FIG. 10 shows a flow diagram for illustrating a method for fabricating a semiconductor device according to the second aspect, wherein the method is adapted to fabricate semiconductor devices of both the first and second aspects

FIG. 10 shows a flow diagram for illustrating a method for fabricating a semiconductor device according to the second aspect.

The method 100 of FIG. 10 comprises providing a carrier (110), providing first and second external contacts (120), providing a semiconductor die comprising a first main face and a second main face opposite to the first main face, a first contact pad disposed on the first main face and a second contact pad disposed on the second main face, wherein the semiconductor die comprises a vertical transistor (130), disposing the semiconductor die with its first main face onto the carrier (140), providing a wire (150), connecting the wire with the second external contact (160), providing a clip (170), connecting the clip between the second contact pad and the first external contact (180), wherein connecting the wire is carried out before connecting the clip (190).

According to an embodiment of the method 100 of FIG. 10, a clip is provided which comprises an insulation layer disposed on a portion of the clip which portion is disposed above the wire.

According to an embodiment of the method 100 of FIG. 10 the method further comprises connecting an insulator body to a portion of the wire, wherein the insulator body is also connected to the second main face of the first semiconductor die.

Further embodiments of the method of FIG. 10 can be formed by combining it with any one of the embodiments or features as were mentioned above in connection with the semiconductor devices of the first aspect.

FIGS. 11A to 11E show respective cross-sectional side view representations of semiconductor devices for illustrating a method for fabricating a semiconductor device, wherein the fabricating of a semiconductor device similar to the one of FIGS. 2A and 2B is shown.

Figure 11A:
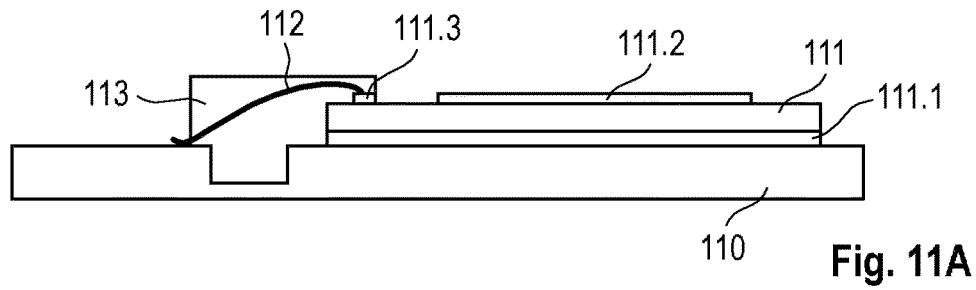
FIG. 11A to 11E show respective cross-sectional side view representations of semiconductor devices for illustrating a method for fabricating a semiconductor device.

FIG. 11A shows an intermediate product of a semiconductor device comprising a partially etched leadframe 110 which functions as a carrier of the semiconductor device to be fabricated. The intermediate product further comprises a semiconductor die 111 comprising a first upper main face and a second lower main face opposite to the first main face, a first contact pad 111.1 on the second lower main face, and second and third contact pads 111.2 and 111.3 on the first upper main face. The semiconductor die 111 is mounted with its first contact pad 111.1 onto a first portion of the leadframe 110. A bond wire 112 is connected between the third contact pad 111.3 and a second portion of the leadframe 110. Furthermore an insulator body 113 is applied to a portion of the bond wire 112, the third contact pad 111.3, a portion of the first upper main face, side faces of the semiconductor die 111 and the first contact pad 111.1, a portion of the upper main face of the leadframe 110 including a recess formed into the leadframe 110 between the first and second portions of the leadframe 110.

Figure 11B:
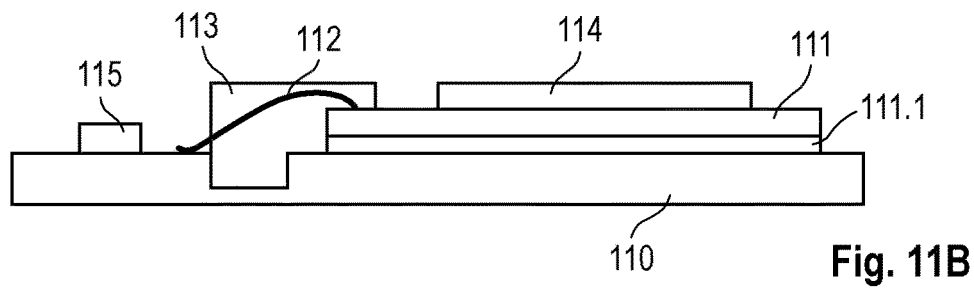

FIG. 11B shows the intermediate product after forming a first solder paste layer 114 onto the second contact pad 111.2 and a second solder paste layer 115 onto the second portion of the leadframe 110.

Figure 11C:
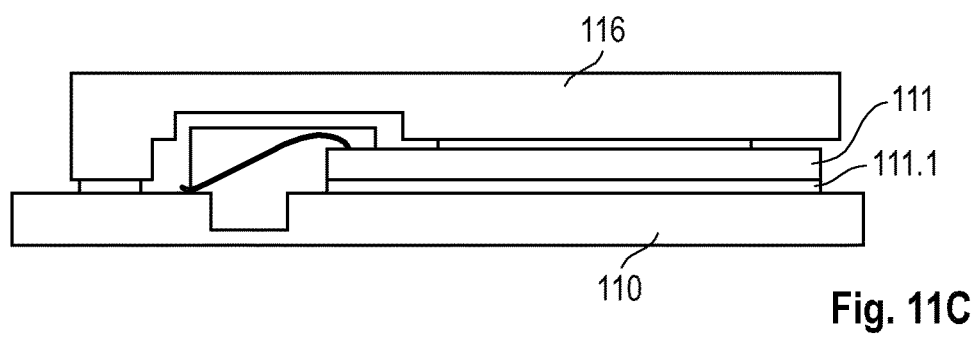

FIG. 11C shows the intermediate product after applying a clip 116 onto the first and second solder paste layers 114 and 115 followed by a reflow process.

Figure 11D:
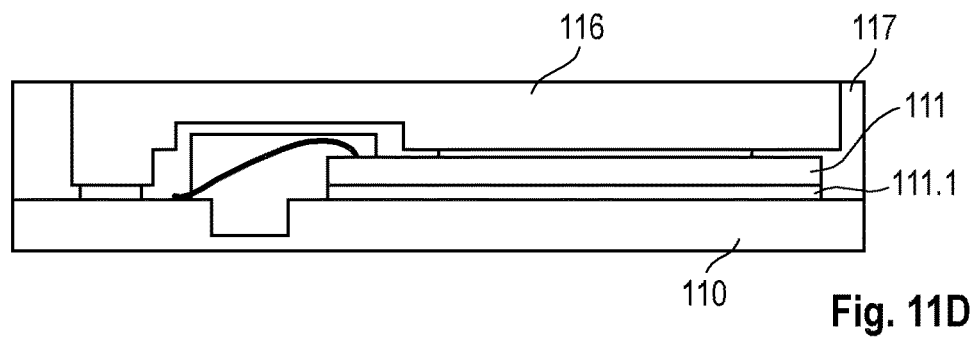

FIG. 11D shows the intermediate product after applying an encapsulant 117 to the semiconductor device in such a way that that it covers the side faces of the clip 116 and is also filled into the inner space between the leadframe 110, the semiconductor die 111, the clip 116, and the insulator body 113. Moreover, the encapsulant 117 is applied in such a way that a main upper face of the clip 116 is exposed to the outside.

Figure 11E:
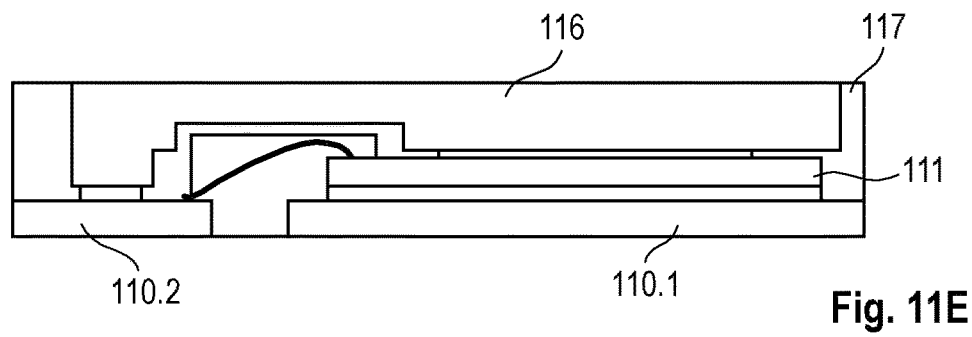

FIG. 11E shows the semiconductor device after removing a portion of the leadframe and thereby generating two separated lead frame portions 110.1 and 110.2. Removing can be performed by, for example, etching or grinding.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device, comprising:
   a first carrier;
   a first external contact and a second external contact;
   a first semiconductor die comprising a first main face, a second main face opposite to the first main face, a first contact pad disposed on the first main face, a second contact pad disposed on the second main face, a third contact pad disposed on the second main face, and a vertical transistor, the first semiconductor die being disposed with the first main face on the first carrier;
   a clip connecting the second contact pad and the second external contact, the clip having a thick portion and a thin portion, the clip comprising a cavity formed by the thin portion; and
   a first wire connected with the first external contact, the first wire being disposed completely under the cavity.

2. The semiconductor device of claim 1, wherein the second contact pad is completely covered by the clip.

3. The semiconductor device of claim 1, wherein the cavity is also disposed above a second wire.

4. The semiconductor device of claim 1, further comprising:
   a first insulation layer disposed on a portion of the clip which is disposed above the wire.

5. The semiconductor device of claim 4, wherein the first insulation layer has the form of a rectangular strip, the rectangular strip being disposed above the wire.

6. The semiconductor device of claim 4, wherein the first insulation layer has the form of a closed ring, the closed ring comprising a portion which is disposed above the wire.

7. The semiconductor device of claim 4, further comprising:
   a second carrier;
   a second insulation layer disposed on the second carrier;
   a second semiconductor die disposed on the second carrier, the second semiconductor die comprising at least one contact pad;
   a third external contact; and
   a second wire connected between the at least one contact pad and the third external contact,
   wherein the second insulation layer is disposed below the second wire.

8. The semiconductor device of claim 4, wherein the first insulation layer comprises one or more of a dielectric, an epoxy type dielectric, a foil, and a film.

9. The semiconductor device of claim 4, wherein the first insulation layer comprises a thickness in a range from 2 μm to 100 μm.

10. The semiconductor device of claim 4, further comprising:
    an encapsulant disposed such that a main face of the clip that is remote from the first semiconductor die is exposed to the outside.

11. The semiconductor device of claim 1, wherein the wire is connected between the third contact pad and the first external contact.

12. The semiconductor device of claim 1, further comprising:
    a second semiconductor die electrically connected with the clip and by the clip with the first semiconductor die.

13. The semiconductor device of claim 1, further comprising:
    a second semiconductor die comprising at least one contact pad,
    wherein the wire is connected between the at least one contact pad and the first external contact.

14. The semiconductor device of claim 1, further comprising:
    an insulator body connected to a portion of the wire, wherein the insulator body is also connected to the second main face of the first semiconductor die.

15. The semiconductor device of claim 14, wherein the insulator body is also connected to a side face of the first semiconductor die and to a main face of the first carrier.

16. The semiconductor device of claim 14, wherein the insulator body comprises one or more of a dielectric, and an epoxy type dielectric.

17. The semiconductor device of claim 1, further comprising:
    an encapsulant, wherein
    the clip comprises a main face remote from the semiconductor die,
    wherein the encapsulant is disposed such that the main face is exposed to the outside.

18. The semiconductor device of claim 1, further comprising:
    an encapsulant,
    wherein the clip comprises a main face remote from the semiconductor die,
    wherein the encapsulant is disposed such that the main face is not exposed to the outside.

19. A semiconductor device, comprising:
a first carrier;
a first external contact and a second external contact;
a first semiconductor die comprising a first main face, a second main face opposite to the first main face, a first contact pad disposed on the first main face, a second contact pad disposed on the second main face, a third contact pad disposed on the second main face, and a vertical transistor, the first semiconductor die being disposed with the first main face on the first carrier;
a clip connecting the second contact pad and the second external contact, the clip having a thick portion and a thin portion, the clip comprising a cavity formed by the thin portion;
a first wire connected with the first external contact, the first wire being disposed completely under the cavity; and
a first insulation layer disposed on a portion of the clip which is disposed above the wire.

20. The semiconductor device of claim 10, further comprising:
an encapsulant disposed such that a main face of the clip that is remote from the first semiconductor die is exposed to the outside.

\* \* \* \* \*